(12) United States Patent
Iguchi et al.

(10) Patent No.: US 8,809,985 B2
(45) Date of Patent: Aug. 19, 2014

(54) LIGHT RECEIVING DEVICE, OPTICAL DEVICE, AND METHOD FOR PRODUCING LIGHT RECEIVING DEVICE

(75) Inventors: Yasuhiro Iguchi, Osaka (JP); Tadashi Saitoh, Osaka (JP); Yasushi Fujimura, Yokohama (JP); Kazunori Tanaka, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/979,586

(22) PCT Filed: Jan. 7, 2012

(86) PCT No.: PCT/JP2012/050213
§ 371 (c)(1),
(2), (4) Date: Jul. 12, 2013

(87) PCT Pub. No.: WO2012/096239
PCT Pub. Date: Jul. 19, 2012

(65) Prior Publication Data
US 2013/0292646 A1    Nov. 7, 2013

(30) Foreign Application Priority Data

Jan. 14, 2011 (JP) .................................. 2011-006139
May 16, 2011 (JP) .................................. 2011-109658

(51) Int. Cl.
*H01L 31/0232* (2014.01)
*H01L 27/146* (2006.01)
*G02B 3/00* (2006.01)
*H01L 31/18* (2006.01)

(52) U.S. Cl.
CPC .... *H01L 31/02327* (2013.01); *H01L 27/14685* (2013.01); *G02B 3/00* (2013.01); *H01L 27/14634* (2013.01); *H01L 31/184* (2013.01); *H01L 27/14627* (2013.01)
USPC ........................................... 257/432; 438/48

(58) Field of Classification Search
USPC ........................................... 257/432; 438/48
See application file for complete search history.

(56) References Cited

FOREIGN PATENT DOCUMENTS

| JP | 06-244392 A | 9/1994 |
|---|---|---|
| JP | 07-030082 A | 1/1995 |
| JP | 10-209414 A | 8/1998 |
| JP | 11-317475 A | 11/1999 |
| JP | 2000-307090 A | 11/2000 |
| JP | 2005-268737 A | 9/2005 |
| JP | 2006-019526 A | 1/2006 |
| JP | 2007-227546 A | 9/2007 |
| JP | 2007-256674 A | 10/2007 |
| JP | 2009-116056 A | 5/2009 |
| JP | 2009-283557 A | 12/2009 |
| JP | 2010-157667 A | 7/2010 |

OTHER PUBLICATIONS

International Search Report in PCT International Application No. PCT/JP2012/050213, dated Feb. 14, 2012.

*Primary Examiner* — Douglas Menz
(74) *Attorney, Agent, or Firm* — Venable LLP; Michael A. Sartori (57) ABSTRACT

A light receiving device includes a microlens 21 located in each of regions corresponding to pixels, the microlens being disposed on a rear surface of an InP substrate 1. The microlens is formed by using a resin material having a range of a transmittance of light in the wavelength region between 0.7 and 3 μm of 25% or less, the transmittance being 70% or more.

20 Claims, 10 Drawing Sheets

FORMATION OF TRENCH

```
LIGHT-RECEIVING
ELEMENT ARRAY ON InP
SUBSTRATE
        │
        ▼
FORMATION OF TRENCH
BY DICING OR ETCHING
OF REAR SURFACE OF
InP SUBSTRATE
```

LIGHT RECEIVING DEVICE, OPTICAL DEVICE, AND METHOD FOR PRODUCING LIGHT RECEIVING DEVICE

TECHNICAL FIELD

The present invention relates to a light receiving device, an optical device, and a method for producing a light receiving device. More specifically, the present invention relates to a light receiving device and an optical device that have a high responsivity to light in the near-infrared to infrared region, the light having a wavelength of at least 1 to 2.5 µm, and a method for producing the light receiving device.

BACKGROUND ART

In an image sensor including light receiving elements that are two-dimensionally arrayed at high density, a structure in which a microlens is arranged for each light receiving element is used in order to increase the light-use efficiency, that is, to increase the responsivity. For example, in a light receiving element formed on an InP substrate, a method has been proposed in which the rear surface of the InP substrate is processed into a lens shape to form a monolithic lens (PTL 1). Also disclosed is a method in which thin plate-shaped silicon, germanium, or sapphire is processed to form a microlens array, and the microlens array is then bonded to a light receiving element array (sensor) (PTL 2). In another proposed method, a resin layer functioning as an underlayer of a lens is formed on a sensor, and a microlens composed of a resin is formed on the resin layer so as to form fine irregularities on a surface thereof, thereby suppressing reflection and increasing the light-condensing efficiency (PTL 3).

CITATION LIST

Patent Literature

PTL 1: Japanese Unexamined Patent Application Publication No. 7-30082
PTL 2: Japanese Unexamined Patent Application Publication No. 10-209414
PTL 3: Japanese Unexamined Patent Application Publication No. 2009-116056

SUMMARY OF INVENTION

Technical Problem

However, in the case where a microlens is monolithically formed on an InP substrate as described above, it is difficult to obtain a uniform lens shape. In particular, InP is difficult to be processed and has a high refractive index of 3.4, and thus it is difficult to increase the degree of light condensation unless InP is processed with a high processing accuracy. In the case where a microlens array is formed on silicon or the like, it is difficult to adjust the position of the microlens array to the position of a light receiving element array with a high accuracy and to bond the microlens array to the light receiving element array, resulting in a decrease in the production yield.

In the microlens array provided on a resin layer functioning as an underlayer, light is absorbed by the resin, resulting in degradation of the responsivity in a predetermined range.

An object of the present invention is to provide a light receiving device and an optical device with which a high-quality light-receiving signal can be obtained with a high responsivity in the near-infrared to infrared region where the wavelength is at least 1 to 2.5 µm, and a method for producing the light receiving device.

Solution to Problem

A light receiving device of the present invention includes a plurality of pixels formed on an InP substrate. The light receiving device includes a microlens located in each of regions corresponding to the pixels, the microlens being disposed on a rear surface of the InP substrate. The microlens is formed by using a resin material having a variation range of a transmittance of light in the wavelength region between 0.7 and 3 µm of 25% or less, the transmittance being 70% or more.

A group III-V compound semiconductor that is epitaxially grown on an InP substrate has a band gap corresponding to the wavelength of light in the near-infrared region or in the near-infrared to infrared region, and is used for receiving light in the near-infrared region or in the near-infrared to infrared region. A light-receiving portion is smaller than a pixel and is formed in a predetermined area inside the pixel. This structure is necessary for allowing pixels to independently function and for preventing crosstalk etc. from occurring between the pixels. Since the light-receiving portion is formed in a small area with a gap between the edge of the pixel and the light-receiving portion in plan view, not all of the light that reaches the rear surface of the InP substrate contributes to the light reception. Therefore, it is possible to further increase the proportion of light that is used, in the light reaching the InP substrate.

With the above structure, a microlens (condenser lens) can be arranged in each region corresponding to a pixel. The condenser lens can condense a parallel beam or a substantially parallel beam close to a focal point. Therefore, a large part of or almost all of the light that reaches the rear surface of the InP substrate can be condensed to the light-receiving portion, and thus the light-use efficiency can be increased.

The microlens is formed by using a resin material having a variation range of a transmittance of light in the wavelength region between 0.7 and 3 µm of 25% or less, the transmittance being 70% or more. In this case, a microlens having high reliability for light having a wavelength of 0.7 to 3 µm can be produced while obtaining the ease of processing of the resin material. Thus, light having a wavelength of at least 1 to 2.5 µm can be received with a high responsivity, and a high-quality image or a high-quality light-receiving signal that is not disturbed by the material forming the microlens can be obtained.

The plurality of pixels may be arranged one-dimensionally or two-dimensionally. In the case of a two-dimensional array, it is necessary that the light receiving device have a structure in which light is incident from a rear surface of a substrate (hereinafter, this structure is also referred to as "rear-illuminated structure") because a read-out electrode of a read-out integrated circuit (ROIC) is connected to a pixel electrode. In the case of a one-dimensional array, light may be incident from the rear surface of a substrate or may be incident from a surface of an epitaxial layer, the surface being located on the opposite side of the substrate. Nevertheless, considering the simplicity of bump connection with the read-out electrode of the ROIC, the rear-illuminated structure is preferred even in the case of the one-dimensional array. In the present invention, it is assumed that light is incident from the rear surface of a substrate even in the case of the one-dimensional array.

A product in which microlenses are provided for each group of a plurality of pixels has a sheet-like shape and is referred to as a "microlens array", "microlens sheet", or the like.

Preferably, the resin material does not substantially include a C—H bond. The reason for this is as follows. A resin including a C—H bond has a large absorption band in the wavelength range of 0.7 to 3 μm. Therefore, when a microlens is formed by using a resin material including a C—H bond, a received signal undergoes a variation due to the absorption band, the variation being larger than the light-receiving signal. As a result, reliability of the light-receiving signal decreases. By forming the microlens using a resin material that does not substantially include a C—H bond, a highly reliable, high-quality light-receiving signal can be obtained while improving the responsivity.

In order to achieve the above object, a fluororesin is preferably selected as the material of the microlens. Among fluororesins, a non-crystalline fluororesin containing, as a main component, a transparent alicyclic fluororesin that does not include a C—H bond is preferably selected. Specifically, a material represented by chemical formula (I) below corresponds to the non-crystalline fluororesin, and examples thereof include CYTOP and LUMIFLON (trade name) that are manufactured by Asahi Glass Co., Ltd. When any of these fluororesins is used, a variation range of a transmittance of light in the wavelength region between 0.7 and 3 μm is 25% or less and the transmittance is 70% or more. Accordingly, the responsivity of the light receiving device is increased, and a high-quality light receiving signal can be obtained.

[Chem. 1]

(1)

n: 1~6

In the formula, m (>1) represents the number of repetitions, and the structure in ( )$_m$ is a basic unit.

A SiN coating film or a SiON coating film is preferably provided between the rear surface of the InP substrate and the microlens.

With this structure, an antireflection effect due to the SiN film or the SiON film is obtained, and the responsivity can be improved. In addition, since the SiN film or the SiON film has a good adhesiveness (adhesion property) with a resin such as a fluororesin, the microlens or the microlens array can be reliably fixed.

A SiN coating film or a SiON coating film may be provided between the rear surface of the InP substrate and the microlens, (i) a treatment agent for enhancing an adhesive force of the SiN film or the SiON film may be provided on a surface of the SiN film or the SiON film or (ii) a treatment agent for enhancing an adhesive force may be contained in the resin material constituting the microlens, and the microlens may be fixed to the SiN film or the SiON film with the treatment agent therebetween.

In the case where there is a problem in terms of adhesiveness between the SiN film or the SiON film and the fluororesin, a treatment agent for enhancing the adhesive force is used. For example, a trace amount of an additive is incorporated in the fluororesin. Alternatively, a solvent containing the additive (adhesion-enhancing agent) may be applied onto the SiN film or the SiON film, and the resulting substrate may then be allowed to stand at a high temperature to volatilize the solvent, thereby further improving the adhesive force with the SiN film or the SiON film. Examples of the most suitable material used as the trace amount of treatment agent include silane treatment agents having a relatively low content of a C—H bond, such as an amine silane coupling agent (KBM 903 manufactured by Shin-Etsu Chemical Co., Ltd.), a mercapto silane coupling agent (KBM 803 manufactured by Shin-Etsu Chemical Co., Ltd.), and a methacryl silane coupling agent (KBM 503). The amount of silane treatment agent used is preferably about 1 part by weight or less relative to 100 parts by weight of the non-crystalline fluororesin from the standpoint of the adhesiveness between the SiN film or the SiON film and the fluororesin and a decrease in the transmittance of light in the wavelength range of 0.7 to 3 μm, the decrease being due to an increase in the C—H bond.

A treatment base layer composed of a treatment agent for enhancing an adhesive force may be provided on the rear surface of the InP substrate, and the microlens may be fixed to the rear surface of the InP substrate with the treatment base layer therebetween. In this case, the adhesive force is enhanced by the treatment agent without using a SiN film or a SiON film.

A trench or a wall is preferably provided along a boundary between the pixels so as to surround the microlens, a depth of the trench or a height of the wall being equal to or smaller than a thickness of the microlens.

With this structure, the light-use efficiency can be improved by providing a microlens on a pixel as large as possible while avoiding contact of the microlens with a microlens of an adjacent pixel. In this case, the microlens is formed by discharging a resin dropwise with a micronozzle.

An absorption layer and a window layer are provided on the InP substrate, a light-receiving portion that constitutes a core of each of the pixels and that receives light includes a p-n junction formed in the absorption layer by selectively diffusing an impurity from the window layer, the light-receiving portion is separated from an adjacent light-receiving portion by a region that is not subjected to the selective diffusion, the pixel is surrounded by the region that is not subjected to the selective diffusion so that the light-receiving portion is located as a center. The microlens is preferably concentric with the light-receiving portion and preferably covers the region that is not subjected to the selective diffusion.

Preferably, the p-n junction may be broadly interpreted as follows. In the absorption layer, when a region on a side opposite to a surface from which an impurity element is introduced by selective diffusion is an impurity region (referred to as "i-region") in which the impurity concentration is low enough for the impurity region to be considered as an intrinsic semiconductor, a junction formed between this i-region and the impurity region formed by the selective diffusion is also included in the p-n junction. That is, the p-n junction may be a p-i junction, an n-i junction, or the like, and a p concentration in the p-i junction or an n concentration in the n-i junction may be substantially as low as a background.

With this structure, the light-receiving portion including, as a main portion, the p-n junction which is an impurity front formed by selective diffusion, and another light-receiving portion adjacent to the light-receiving portion are located with a relatively large gap therebetween. Therefore, light incident on the gap, which is a region that has not been subjected to the selective diffusion, is not received and passes through in many cases. By arranging the above microlens, a high responsivity can be obtained even when the light-receiving portion is formed by selective diffusion.

Preferably, a diameter of the light-receiving portion is substantially the same as a minimum width of the region that is not subjected to the selective diffusion, and the microlens is formed so as to occupy the pixel so that the shape of the microlens is inscribed in a section of the pixel.

With this structure, it is possible to substantially eliminate a region irradiated with light that cannot be received, and thus the responsivity can be improved.

The absorption layer may be constituted by a type-II multi-quantum well structure (MQW) composed of two different group III-V compound semiconductors that are lattice-matched with InP in a range of ±0.5%.

When a type-II MQW is used in order to provide a responsivity at a long wavelength of the near-infrared region, light is received at an interface between two layers composed of different types of group III-V compound semiconductors. For this purpose, several tens to several hundreds of layer interfaces or several tens to several hundreds of pairs of the layers are usually formed in order to ensure the responsivity. Nevertheless, the responsivity may be insufficient. In the case where a light receiving device includes an absorption layer having such a type-II MQW, by arranging a microlens, a high responsivity can be obtained while the light-receiving wavelength range is extended to the long-wavelength side of the near-infrared region.

An optical device of the present invention includes any of the light receiving devices described above and a read-out integrated circuit (ROIC).

With this structure, it is possible to provide an optical device which has a high responsivity and in which a highly reliable light-receiving signal can be obtained. The optical device may have any structure as long as the above light receiving device and an ROIC are included.

A method for producing a light receiving device of the present invention includes the steps of forming, on an InP substrate, an array of light receiving elements having a responsivity at a wavelength of at least 1 to 2.5 μm, the light receiving elements functioning as pixels; and forming a microlens array over an entire surface of the InP substrate by providing, on a rear surface of the InP substrate, a microlens for each of the pixels, the microlens containing a fluororesin as a main component. In the step of forming a microlens array, a fluororesin-containing agent prepared by dissolving a fluororesin in a solvent and adjusting a viscosity of the resulting solution is discharged using a micronozzle to form a droplet-shaped body or mountain-shaped body composed of the fluororesin-containing agent in each of regions of the pixels, and a drying treatment is then performed to form the microlens array composed of the fluororesin. The fluororesin-containing agent may be a fluororesin-containing agent prepared by dissolving a non-crystalline fluororesin and a silane coupling agent (such as an aminosilane coupling agent) serving as a treatment agent in a solvent at a ratio of the fluororesin to the silane coupling agent of 100:0.1 and adjusting the viscosity of the resulting solution. This fluororesin-containing agent may be discharged using a micronozzle to form a droplet-shaped body or mountain-shaped body composed of the fluororesin-containing agent in each of regions of the pixels, and a drying treatment may then be performed to form the microlens array composed of the fluororesin. If necessary, the method may further include, prior to the formation of the droplet-shaped body or mountain-shaped body composed of the fluororesin-containing agent, a step of spraying a silane coupling agent as a treatment agent on the InP substrate, and then conducting a drying treatment.

Furthermore, a coating film which is a SiN film or a SiON film may be formed on the rear surface of the InP substrate, and the InP substrate may be more stably fixed to the microlens array composed of the fluororesin by the adhesive force of the SiN film or the SiON film.

Alternatively, in forming a SiN film or a SiON film, a treatment agent for enhancing the adhesive force of the SiN film or the SiON film may be applied onto a surface of the SiN film or the SiON film, and the microlens array may then be formed. Thus, the adhesive force of the microlens array may be enhanced.

With the above method, a microlens array composed of a fluororesin can be easily obtained with high efficiency by discharging a fluororesin-containing agent dropwise by micropotting or ink jetting and conducting a drying treatment. Since the fluororesin-containing agent has water repellency, a droplet-shaped body or a mountain-shaped body can be formed with a large contact angle with an underlayer. Accordingly, a light receiving device which has a high economical efficiency and a high responsivity, and which can provide a high-quality light-receiving signal can be easily produced.

Preferably, the method further includes, before the step of forming a microlens array, a step of forming a trench or a wall at a boundary between the adjacent pixels so as to prevent the droplet-shaped body or mountain-shaped body composed of the fluororesin-containing agent from contacting and combining with a droplet-shaped body or mountain-shaped body of an adjacent pixel, the droplet-shaped body or mountain-shaped body being composed of the fluororesin-containing agent.

In the ink jet method or the micropotting method, the fluororesin-containing agent contains a solvent in an amount of about 90% and thus is substantially a liquid. Therefore, when droplet-shaped bodies of adjacent pixels contact with each other, the droplet-shaped bodies combine by the effect of surface tension etc., the water repellency is decreased, and the droplet-shaped bodies do not form the shape of each microlens. By providing the trench or the wall at the boundary of pixels, contact between droplet-shaped bodies can be prevented, and a microlens can be formed from each of the droplet-shaped bodies or the mountain-shaped bodies.

As described above, as means for improving adhesiveness between the fluororesin to be formed into microlenses and the InP substrate, prior to the formation of the droplet-shaped bodies or mountain-shaped bodies composed of the fluororesin-containing agent, a silane coupling agent serving as a treatment agent may be sprayed onto the InP substrate two or three times with a sprayer, and the substrate may then be dried at 85° C. for about two hours. In this case, a silane coupling agent serving as a treatment agent need not be incorporated in advance in the non-crystalline fluororesin forming the microlenses. In addition, by conducting the drying step, it is possible to suppress, in the microlenses etc., the presence of an unnecessary C—H-bond-containing substance, which adversely affects the optical transparency in the wavelength range of 0.7 to 3 μm.

In the step of forming a wall, a covering layer is preferably formed on the rear surface of the InP substrate, and a portion of the covering layer other than a portion to be formed into the wall is preferably removed by etching.

In this case, for example, a SiN film or a hydrophilic resist film is formed as the covering layer, and a wall of this film is easily formed. Thus, one microlens can be formed for each pixel without causing a combination of droplet-shaped bodies.

Another method for producing a light receiving device of the present invention includes the steps of forming, on an InP substrate, an array of light receiving elements having a responsivity at a wavelength of at least 1 to 2.5 µm, the light receiving elements functioning as pixels; and forming a microlens array over an entire surface of the InP substrate by providing, on a rear surface of the InP substrate, a microlens for each of the pixels, the microlens containing a fluororesin as a main component. The step of forming a microlens array includes the steps of preparing a die functioning as a female die of the microlens array, applying, onto the rear surface of the InP substrate, a fluororesin-containing agent prepared by dissolving the fluororesin in a solvent and adjusting a viscosity of the resulting solution to form a coating layer, and pressing the die onto the coating layer that is moderately dried, while adjusting the position of the die to the position of the pixels, to form a microlens array in which convex lenses functioning as microlenses are arranged.

With the above method using a die, a microlens array can be simply formed with high efficiency. The method for applying a fluororesin-containing agent onto the rear surface of the InP substrate is not particularly limited. For example, a screen printing method or a spin-coating method is preferably used.

Also in the case where a microlens array is formed using a die, as in the method using a micronozzle, the adhesion between the microlens array and the InP substrate may be stabilized by interposing a coating film which is a SiN film or a SiON film. Regardless of the presence or absence of the coating film, the adhesion may be enhanced by using a treatment agent for enhancing an adhesive force (which may be applied directly onto the rear surface of the InP substrate, incorporated in the fluororesin-containing agent, or applied onto a surface of the SiN film or the SiON film). These treatments with the treatment agent may be performed alone or in combination.

Advantageous Effects of Invention

According to the light receiving device of the present invention, a high-quality light-receiving signal can be obtained with a high responsivity in the near-infrared to infrared region having a wavelength of at least 1 to 2.5 µm.

REFERENCE SIGNS LIST

1 InP substrate, 3 absorption layer, 3a GaAsSb, 3b InGaAs, 4 diffusion concentration distribution control layer, 5 window layer, 6 p-type region, 9 bump, 11 pixel electrode (p-portion electrode), 15 p-n junction, 17 selective diffusion mask pattern (passivation film), 21 microlens, 21a fluororesin-containing agent layer, 22 trench, 23 wall, 27 SiN film or SiON film, 29 treatment base layer, 33 type-II MQW absorption layer, 35 die, 35f surface of die, 50 light receiving device, 70 ROIC, 71 read-out electrode, 79 bump, 100 optical device, K boundary of MQW pair, P pixel.

DESCRIPTION OF EMBODIMENTS (Embodiment 1)

Figure 1:
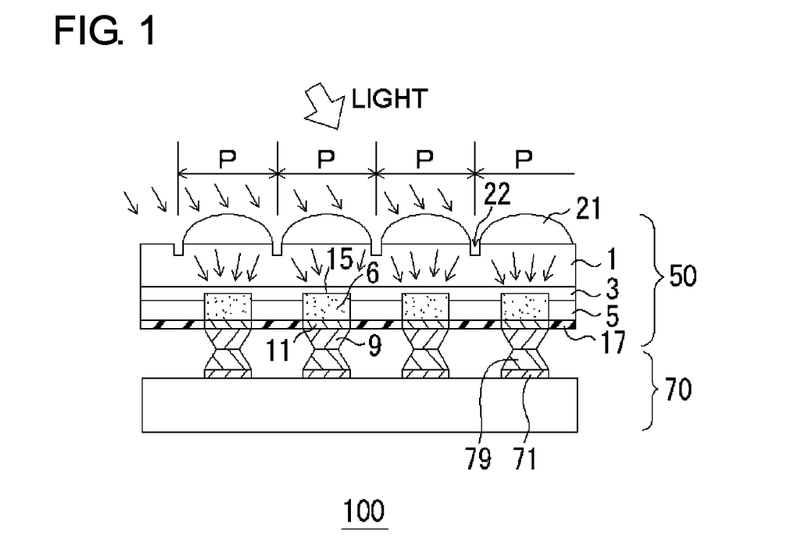
FIG. 1 is a view illustrating a light receiving device and an optical device according to Embodiment 1 of the present invention.

FIG. 1 is a view illustrating a light receiving device 50 and an optical device 100 according to an embodiment of the present invention. The light receiving device 50 includes a plurality of pixels P. An InP-based epitaxial layer including an absorption layer 3 and a window layer 5 is formed on an InP substrate 1. A p-type region 6 is formed by introducing a p-type impurity such as zinc (Zn) by selective diffusion from an opening of a selective diffusion mask pattern 17, and extends to the inside of the absorption layer 3. The selective diffusion mask pattern 17 also functions as a passivation film. After the selective diffusion mask pattern 17 is used in the selective diffusion of zinc (Zn), which is a p-type impurity, the selective diffusion mask pattern 17 is left without further treatment. When a reverse-bias voltage is applied between a common ground electrode (not illustrated) and a pixel electrode 11 that is in ohmic contact with the p-type region, each of the pixels P receives target near-infrared light in a depletion layer projecting from a p-n junction 15. At this time, electron-hole pairs are generated, and these are read out from the pixel electrode and the ground electrode to obtain a light-receiving signal.

A read-out electrode 71 of a read out IC (ROIC) 70 that reads out a light-receiving signal and the pixel electrode 11 of the light receiving device 50 face each other and are electrically connected to each other through connection bumps 9 and 79. In the case where a light-receiving signal from a pixel P of the light receiving device is read out using an ROIC, the light receiving device has a substrate (rear)-illuminated structure, as described above.

The present embodiment has the following two features.

(1) Microlenses 21 functioning as condenser lenses are arranged on the rear surface of the InP substrate 1. The microlenses 21 are each a convex lens and composed of a fluororesin. The transmittance of light in the wavelength range of 0.7 to 3 µm in a fluororesin will be shown below.

Since the fluororesin does not include a C—H bond, the fluororesin does not have a large absorption band in the wavelength range of 0.7 to 3 µm. In addition, the fluororesin has a refractive index of about 1.3 to 1.5. Accordingly, a parallel beam or a substantially parallel beam can be condensed on a light-receiving portion located near a focal plane or in the vicinity of the p-n junction 15 by providing the convex lens in each region of the pixel P even without performing highly precise processing. The accuracy necessary for the curvature of the surface of the microlens is not so high because even when the focal length is short to some extent (even when light is focused at a position above the p-n junction 15), the light crosses at the upper position, then diverges, and condenses on the light-receiving portion. In addition, even when the focal length is long to some extent, the light flux is reliably condensed on the light-receiving portion.

As a result, the responsivity can be increased. As described above, the p-n junction 15 is formed in the leading end of the p-type region 6 formed by selective diffusion, and light is received in a depletion layer projecting from the p-n junction 15 by applying a reverse-bias voltage. Therefore, in plan view, most part of light applied onto the rear surface of the InP substrate 1 passes through without passing through the p-n junction 15 (refer to FIG. 2).

Figure 2:
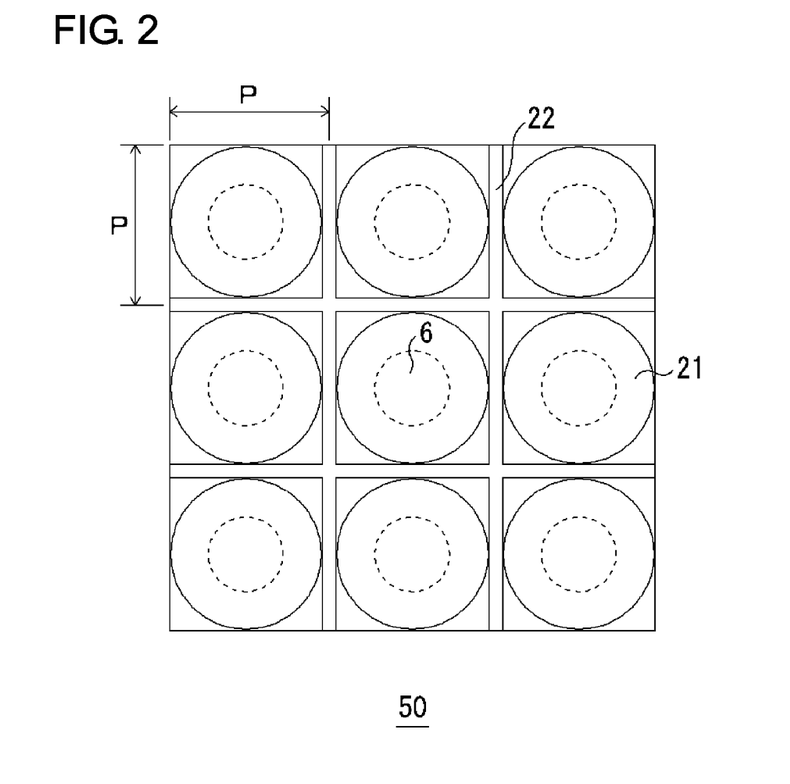
FIG. 2 is a plan view of a part of the light receiving device in FIG. 1.

FIG. 2 is a plan view of a part of the light receiving device illustrated in FIG. 1. FIG. 2 illustrates a two-dimensional array of the p-type regions 6 and the pixels P. In FIGS. 1 and 2, for example, the diameter of an opening of the selective diffusion mask pattern 17 for forming the p-type region 6 is 15 µm, and the pixel pitch is 30 µm. A plane occupancy ratio of the p-type region 6 to the pixel P is about 20%. In other words, after a parallel beam or a substantially parallel beam reaches an InP substrate, only about 20% of the beam can be received on the assumption that the amount of beam reflected is zero.

In general, when the p-type regions 6 or the pixels P are formed by selective diffusion, it is necessary to ensure a sufficient gap between adjacent pixels P so that interference such as crosstalk does not occur between the pixels P. Furthermore, in selective diffusion, it is necessary to consider that an impurity introduced from an opening diffuses not only in the depth direction but also in the lateral direction, though the amount of diffusion in the lateral direction is very small. For this reason, in reality, a gap (i.e., a minimum width of a region that is not subjected to the selective diffusion, the region being located between the p-type regions 6) substantially the same as the diameter of the p-type region 6 is formed in plan view. As a result, as illustrated in FIG. 2, the p-type region 6 has a plane occupancy ratio of about 20%. However, this method is advantageous in that the crystals are not easily damaged and a dark current can be reduced, as compared with another method for maintaining the independence of a pixel P from other pixels, for example, a method in which a deep trench is formed at a boundary between pixels by mesa etching.

As illustrated in FIG. 2, when a microlens 21 is formed as large as possible so that the shape of the microlens 21 is inscribed in the shape of a pixel in order to increase the responsivity, the amount of light that can contribute to the light reception is significantly increased to about 78%. As illustrated in FIG. 1, a convex lens can condense a parallel beam or a substantially parallel beam applied onto the convex lens on a light-receiving portion located near a focal plane or in the vicinity of the p-n junction 15. Light reflected from a surface of an object or the like and reaching the light receiving device 50 is almost parallel and condensed in the vicinity of the focal plane by the action of the convex lens or the microlens 21.

Figure 3A:
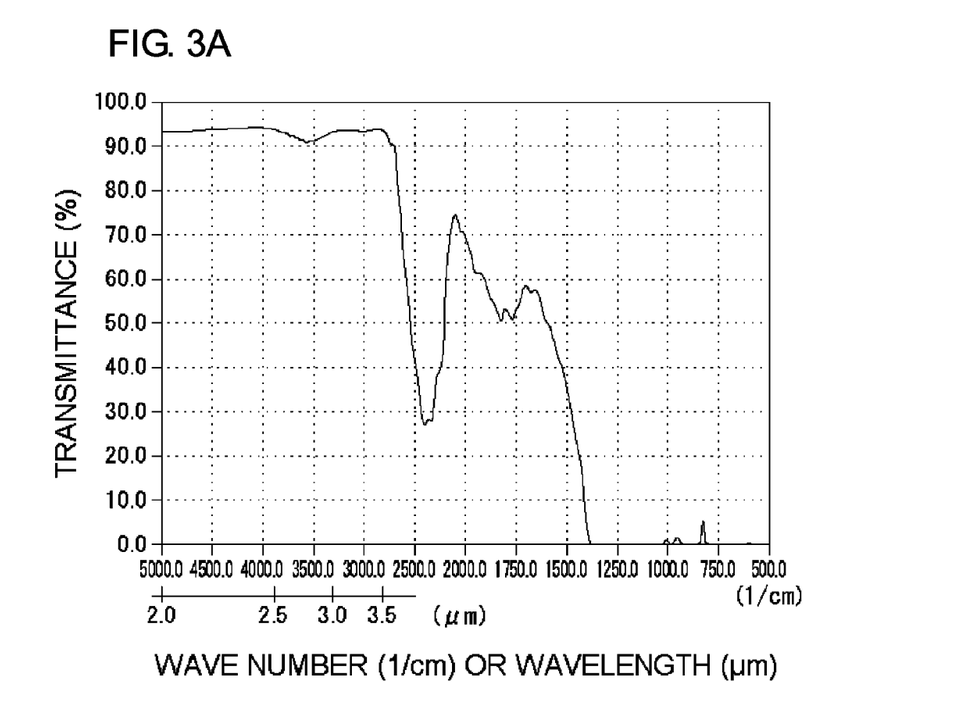
FIG. 3A is a chart showing a relationship between the transmittance of a fluororesin and the wavelength, and showing a range of a wavelength of 2.0 µm or more.
Figure 3B:
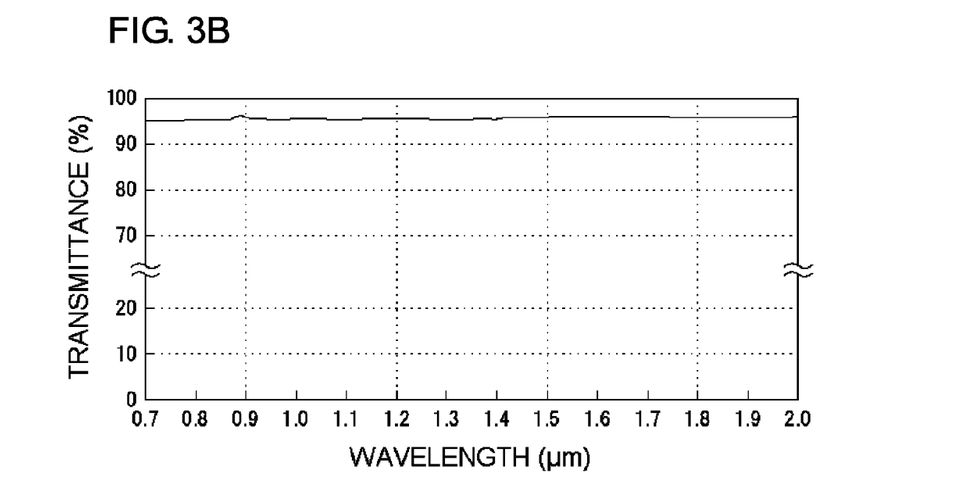
FIG. 3B is a chart showing a relationship between the transmittance of a fluororesin and the wavelength, and showing a range of 0.7 to 2.0 µm.

FIGS. 3A and 3B are charts showing the transmittance of a fluororesin. As shown in FIGS. 3B and 3A, in the wavelength ranges of 0.7 to 2.0 µm, and 2.0 to 3.5 µm, the fluororesin has a transmittance of 95% and 93%, respectively. In addition, the transmittance does not vary and is substantially flat with respect to the wavelength.

In the case of a resin including a C—H bond, the transmittance with respect to the wavelength significantly varies. That is, a resin including a C—H bond has an absorption band in the most important wavelength range of 1 to 2.5 µm. In addition, for example, silicon oxide also has a plurality of very large absorption bands in the important wavelength range of 1 to 3 µm. Accordingly, even if the amount of light that can contribute to the light reception is increased by providing a microlens composed of a resin including a C—H bond or silicon oxide to increase the responsivity, the variation in the transmittance of the microlens is emphasized by the condensation of light and included in the resulting light-receiving signal. Consequently, reliability of the light-receiving signal is impaired.

By using a microlens 21 composed of a fluororesin as in the present embodiment, a highly reliable light-receiving signal can be obtained while the amount of light that can contribute to the light reception is increased to increase the responsivity.

(2) Another feature is a trench 22 provided at the boundary of pixels. In the case where a microlens 21 is provided so that the shape of the microlens 21 is inscribed in a square of a pixel P so that the microlens 21 has as large an area as possible, the following problem occurs. When droplet-shaped bodies composed of a fluororesin-containing agent having a viscosity close to a liquid are arranged for respective pixels by micropotting or ink jetting so as to have a maximum area, the droplet-shaped bodies easily contact with each other (the production method will be described below). If the droplet-shaped bodies contact with each other before drying, the two droplet-shaped bodies combine by the effect of surface tension etc., the contact angle with an underlayer is decreased, the shape of each droplet is not maintained, and the droplet-shaped bodies substantially spread out over the underlayer. As a result, the shape of a lens is not formed. Accordingly, the trench 22 is provided between the pixels P as illustrated in FIGS. 1 and 2, and the crossing of the droplet-shaped bodies over the boundary can be prevented by the trench.

Figure 4:
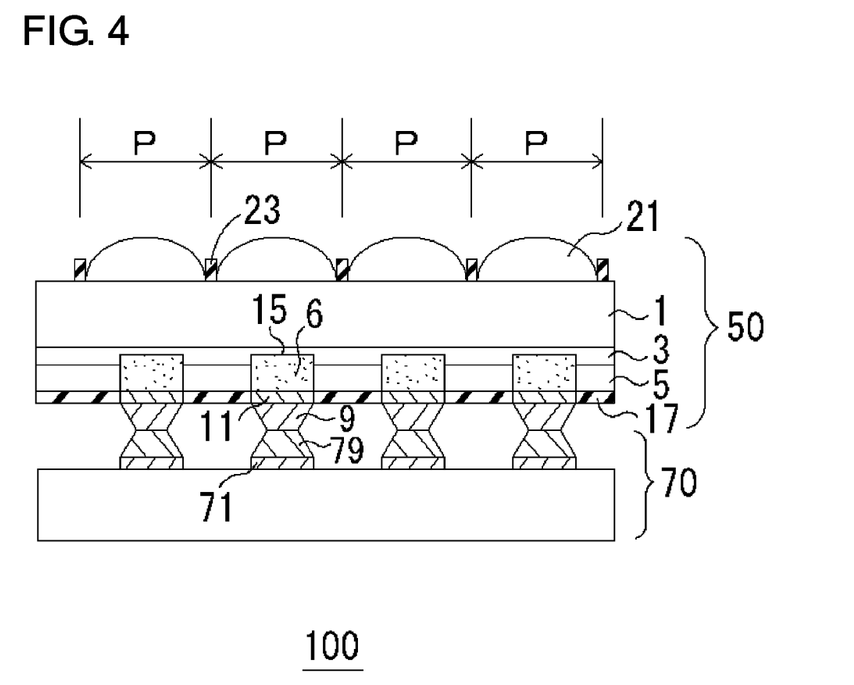
FIG. 4 is a view illustrating a modification of the light receiving device in FIG. 1 and illustrating a light receiving device and an optical device including the light receiving device of the present invention.

The trench 22 may be a wall. FIG. 4 is a view illustrating a light receiving device 50 in which the trench 22 illustrate in FIG. 1 is replaced with a wall 23. The wall 23 can also prevent droplet-shaped bodies from crossing over the boundary between pixels P.

The trench 22 or the wall 23 may have the following dimensions, for example.

Figure 5:
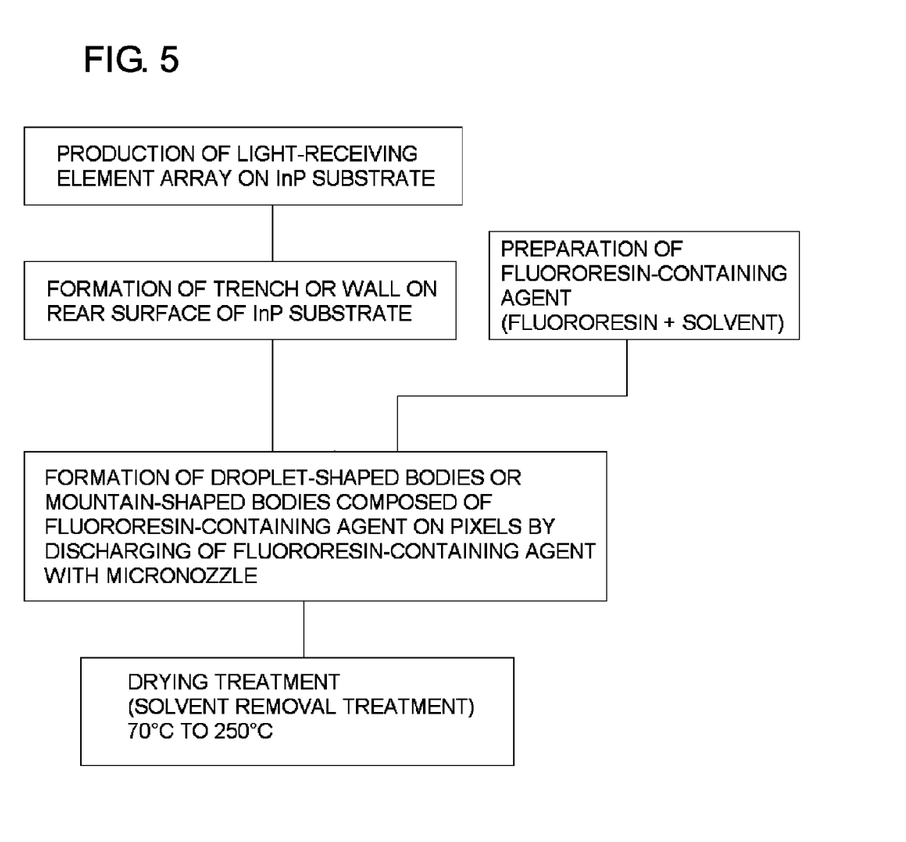
FIG. 5 is a flowchart showing a method for producing a light receiving device according to Embodiment 1.

<Trench>: width: 1 µm, depth: 1 to 2 µm
<Wall>: width: 1 µm, height: 0.11 to 0.3 µm FIG. 5 is a flowchart showing a method for producing a light receiving device 50 according to an embodiment of the present invention. First, a light receiving element array is formed on an InP substrate. Next, as illustrated in FIG. 1 or FIG. 4, a trench 22 or a wall 23 is formed on the rear surface of the InP substrate 1 in accordance with the structure including the trench 22 or the wall 23.

A fluororesin-containing agent for forming microlenses is prepared during the formation of the trench 22 or the wall 23. A non-crystalline fluororesin containing, as a main component, a transparent alicyclic fluororesin that does not include a C—H bond is preferably selected as the fluororesin. Specifically, a non-crystalline fluororesin represented by chemical formula (1) below is preferable, and examples thereof include CYTOP and LUMIFLON (trade name) that are manufactured by Asahi Glass Co., Ltd. When any of these fluororesins is used, a variation range of a transmittance of light in the wavelength region between 0.7 and 3 μm is 25% or less and the transmittance is 70% or more.

[Chem. 2]

(1)

n: 1~6

In the formula, m (>1) represents the number of repetitions, and the structure in ( )$_m$ is a basic unit.

A dilution solvent is not particularly limited as long as the dilution solvent functions as a solvent. Examples of the dilution solvent include ethanol, isopropyl alcohol/isobutyl acetate, and water. In the case where a droplet-shaped body is placed for each pixel by ink-jetting or micropotting using a micronozzle, for example, the content of a fluororesin polymer is preferably about 5% to 15% and the content of the remaining solvent etc. is preferably about 95% to 85%. As described above, the accuracy necessary for the curvature of the surface of a droplet-shaped body or a mountain-shaped body is not so high because even when the focal length is short to some extent (even when light is focused above the p-n junction 15), the light is condensed on the light-receiving portion. In addition, even when the focal length is long to some extent, the light is reliably condensed to improve the responsivity.

A droplet-shaped body or mountain-shaped body composed of the fluororesin-containing agent is formed for each pixel P using a micronozzle. After the droplet-shaped bodies are arranged for all the pixels P, a drying treatment is started. In the drying treatment, the resulting substrate is placed in a thermostatic chamber that is maintained at a constant temperature in the range of 70° C. to 250° C. to remove the solvent. The drying treatment may be separately conducted several times by increasing the temperature stepwise from a low-temperature chamber to a high-temperature chamber.

Figure 6A:
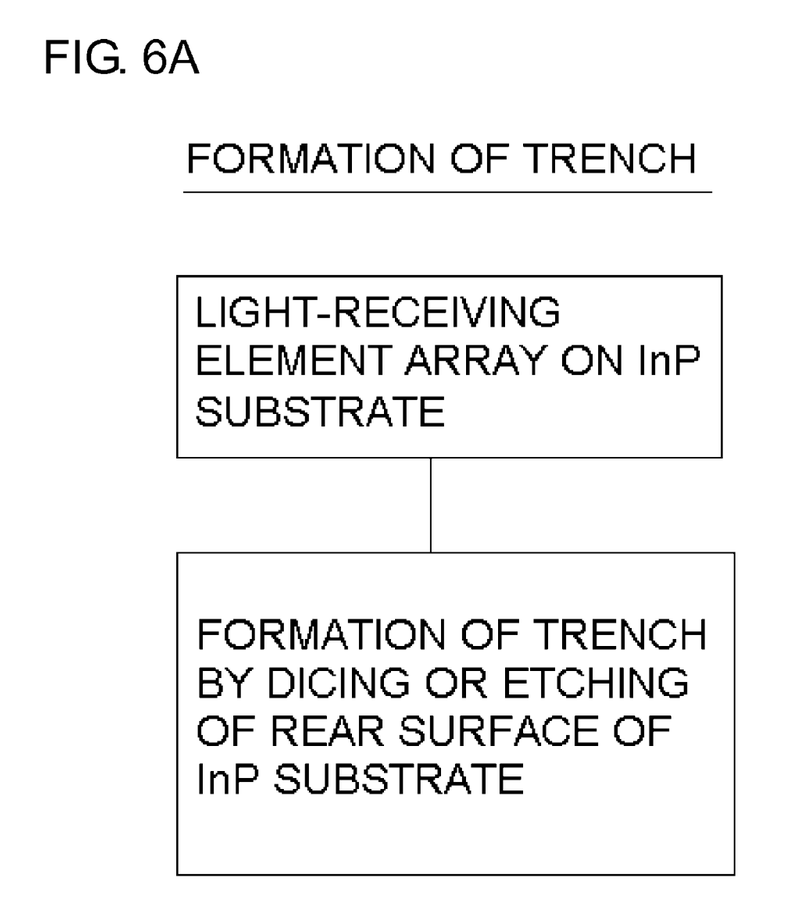
FIG. 6A is a flowchart showing a method for forming a trench.
Figure 6B:
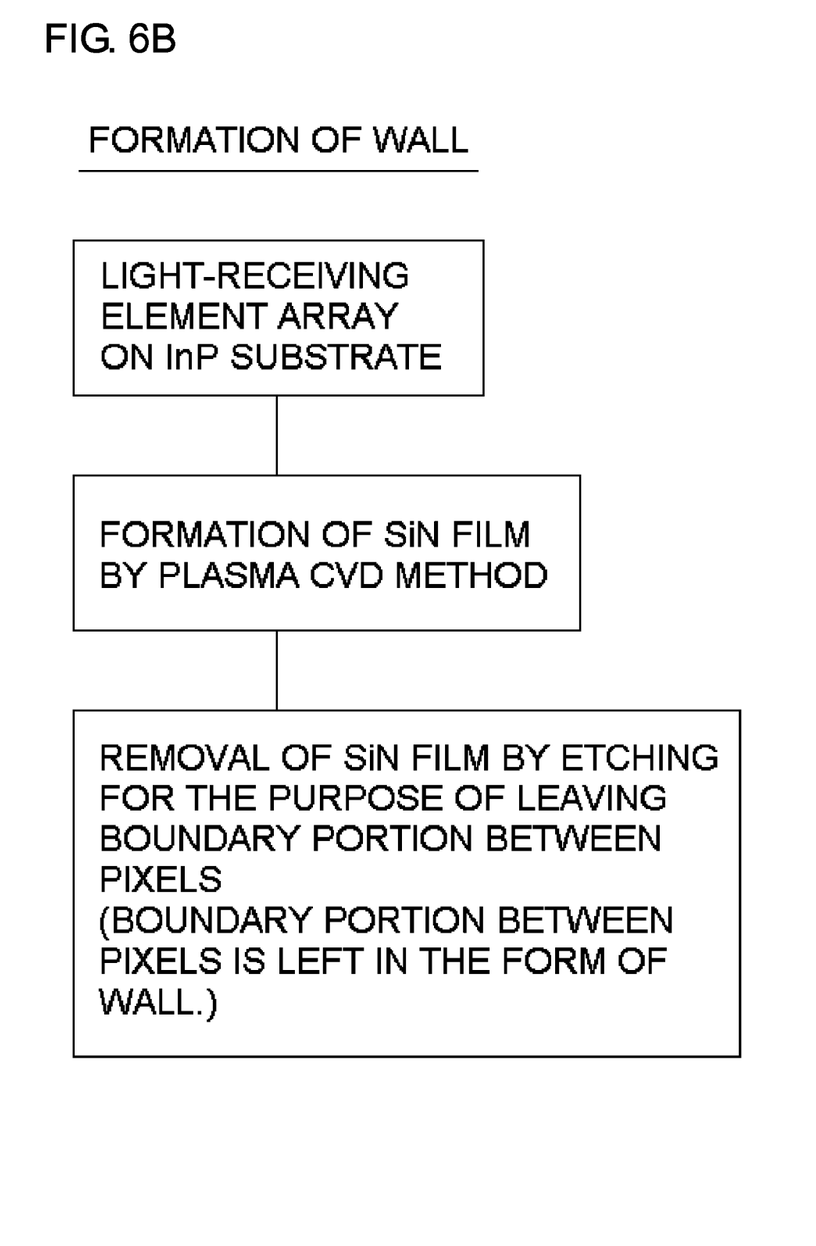
FIG. 6B is a flowchart showing a method for forming a wall.

FIG. 6A is a flowchart showing a method for forming a trench 22. FIG. 6B is a flowchart showing a method for forming a wall 23. In the case of the trench 22, the trench is formed by performing dicing or etching along the boundary of pixels P. In the case of the wall 23, a SiN film is formed on the rear surface of the InP substrate 1 by, for example, a chemical vapor deposition (CVD) method. The thickness of the SiN film is preferably the same as the thickness of the wall 23, for example, 0.11 to 0.3 μm. Subsequently, a region other than a region to be formed into the wall 23 is removed by etching.

According to the above production method, an array of the microlenses 21 that significantly improve the responsivity can be simply and easily produced by a micropotting method or an ink jet method at a high production yield without requiring a particular large-scale apparatus while preventing droplet-shaped bodies or mountain-shaped bodies from crossing over the boundary between pixels.

(Embodiment 2)

Figure 7:
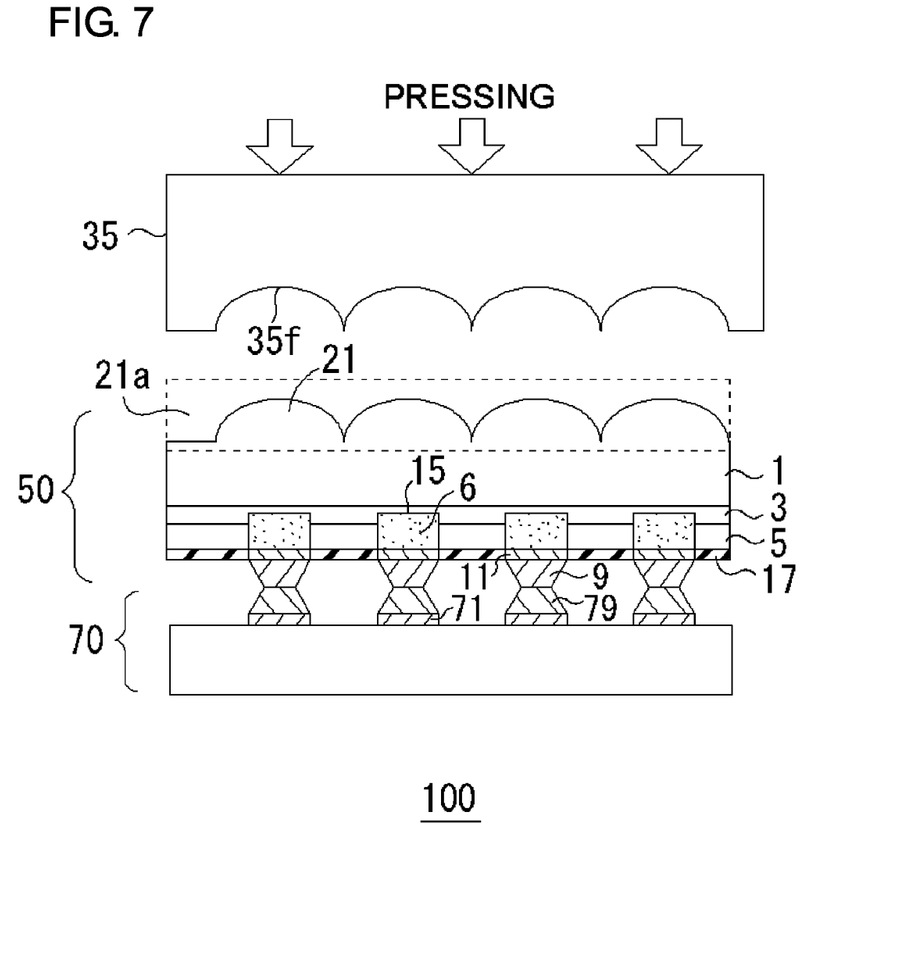
FIG. 7 is a view illustrating a light receiving device and an optical device according to Embodiment 2 of the present invention (where a step of pressing a die is performed on the light receiving device alone before the light receiving device is combined with an ROIC).

FIG. 7 is a view illustrating a light receiving device 50 and an optical device 100 according to Embodiment 2 of the present invention, and a method for producing the light receiving device 50 and the optical device 100. The present embodiment is similar to Embodiment 1 in that the light receiving device 50 including microlenses 21 is combined with an ROIC 70. The present embodiment differs from Embodiment 1 in that the microlenses 21 are formed by an imprint method using a die 35 which is a female die corresponding to the surface shape of the microlenses 21.

In FIG. 7, the microlenses 21 are illustrated as if they were formed after the optical device 100 was fabricated for the sake of convenience of explanation. In reality, the step of forming microlenses by pressing a die is performed on the light receiving device 50 alone before the light receiving device 50 is combined with the ROIC. Under the assumption of the above precondition, as illustrated in FIG. 7, an array of the microlenses 21 is formed by pressing a surface 35f of the die 35 onto a fluororesin-containing agent layer 21a, which is a diluted resin before drying and is in a state where the layer 21a can be easily subjected to plastic working.

Figure 8:
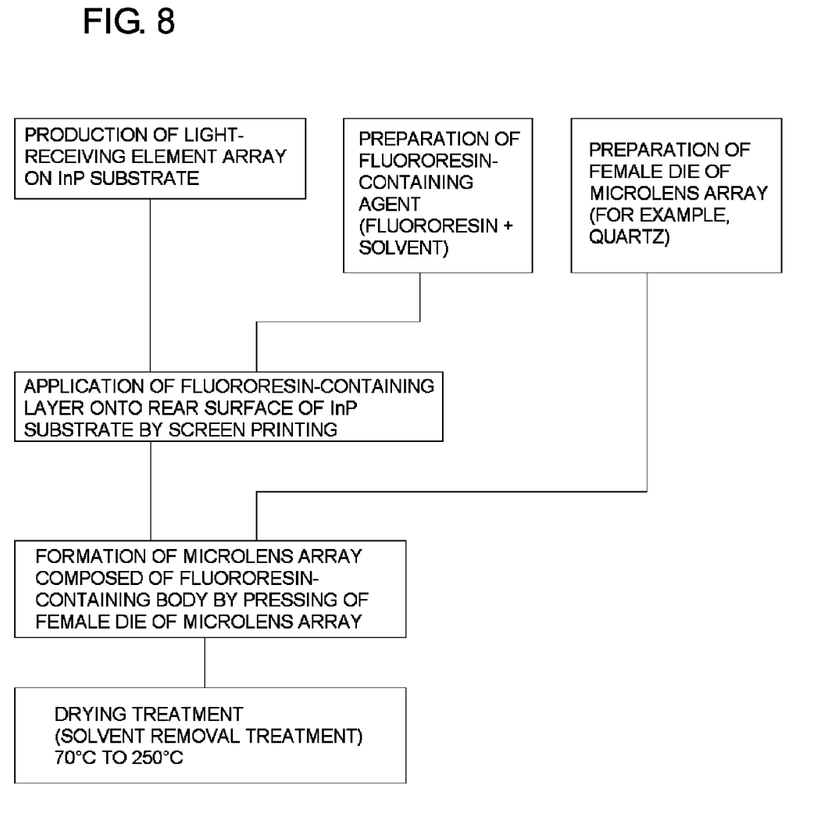
FIG. 8 is a flowchart showing a method for producing a light receiving device according to Embodiment 2.

FIG. 8 shows a procedure for forming a microlens array by an imprint method. In the imprint method, the production of the die 35 is important. The production of the die 35 for pressing requires fine processing, and the die 35 can be produced by forming irregularities by lithography using electron beam exposure. Quartz or the like is preferably used as the material of the die 35 because wear resistance is required for the material.

When the fluororesin-containing agent layer 21a is formed, the viscosity of the fluororesin-containing agent is preferably controlled to be slightly higher than that in the case of the micropotting method or the inkjet method. An array of the microlenses 21 can be easily obtained by pressing the die 35 produced by the method described above.

Whether microlenses are formed by a micropotting method or an imprint method can be determined by observing the microlenses with a microscope. A trench 22 or a wall 23 is often provided when microlenses are formed by the micropotting method, and thus the method for forming the microlenses can also be identified by the presence or absence of the trench or the wall.

(Embodiment 3)

Figure 9A:
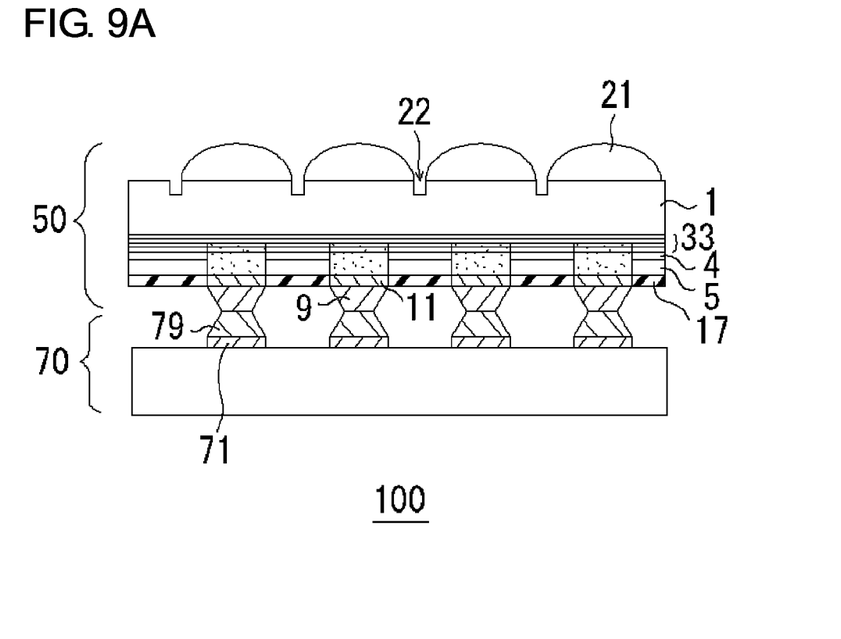
FIG. 9A is a view illustrating a light receiving device and an optical device according to Embodiment 3 of the present invention.
Figure 9B:
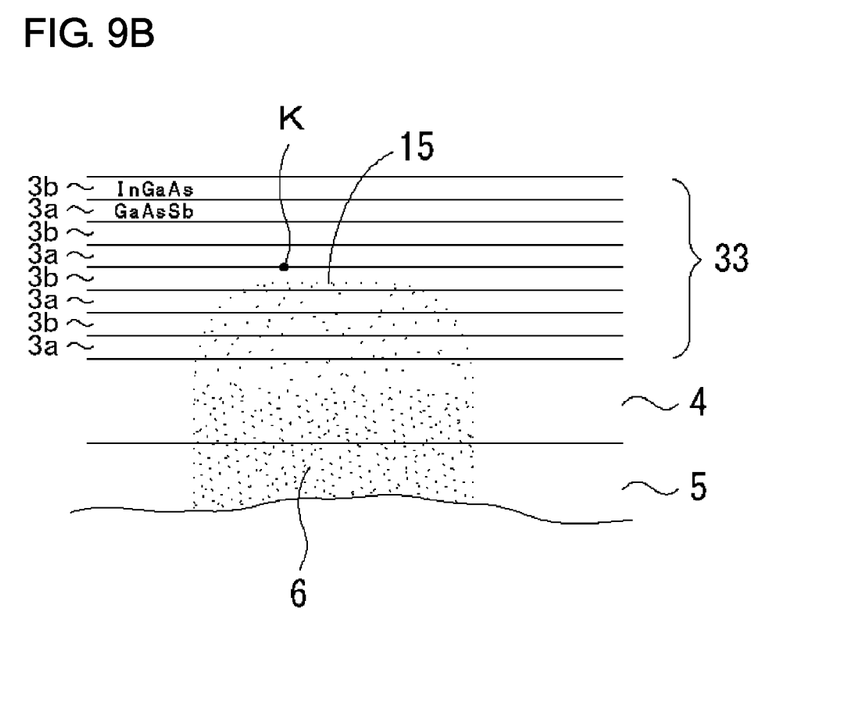
FIG. 9B is a view illustrating an absorption layer in the light receiving device in FIG. 9A.

FIG. 9A is a view illustrating a light receiving device 50 and an optical device 100 according to Embodiment 3 of the present invention. FIG. 9B is an enlarged view of an absorption layer 33 etc. included in a pixel. The absorption layer 33 in the present embodiment has a type-II multi-quantum well structure (MQW) including GaAsSb 3a and InGaAs 3b as a basic pair. In this type-II MQW, an electron in the valence band of GaAsSb transits to the conduction band of InGaAs to generate an electron/hole pair, and thus light reception occurs. Since the difference in energy between the valence band of GaAsSb and the conduction band of InGaAs is smaller than the difference in energy between the valence band and the conduction band in GaAsSb (InGaAs), long-wavelength light having a low energy can be received. However, as described above, since an electron in the valence band of GaAsSb transits to the conduction band of InGaAs, light is received only at an interface of the multi-quantum well structure (MQW), namely, at an interface K exemplified in FIG. 9B. In this manner, in the type-II MQW, a place where the transition occurs is limited as compared with a transition phenomenon that occurs in bulk. Accordingly, even when the number of pairs of the MQW is increased, the responsivity is low.

A light receiving element including a type-II MQW absorption layer 33 has a particular structure in order to maintain a good crystal quality. For example, if an impurity concentration is excessively high, the crystal quality of the MQW is degraded. Therefore, a diffusion concentration distribution control layer 4 for selective diffusion is arranged, and the p-type impurity concentration is significantly decreased in the diffusion concentration distribution control layer 4 so that the absorption layer 33 has a concentration distribution that is stable in a low range. In addition, forming a pixel by selective diffusion is also preferable in view of the crystal quality of the type-II MQW.

The reason why such a light receiving device including a type-II MQW absorption layer 33 inherently has a low responsivity, though the responsivity can be extended to the long-wavelength side, is due to a light absorption mechanism. In such a light receiving device, the above-described microlenses 21 can achieve a significant advantage. Specifically, in the light receiving device 50 and the optical device 100 according to the present embodiment, a low responsivity due to the light absorption mechanism is compensated for and a responsivity at a predetermined level or higher can be ensured while the responsivity is extended to light in the long-wavelength region of the near-infrared region. Furthermore, since the microlenses 21 are composed of a fluororesin, a high-quality light-receiving signal can be obtained in the near-infrared region and a long-wavelength region of the near-infrared region.

(Embodiment 4)

Figure 10:
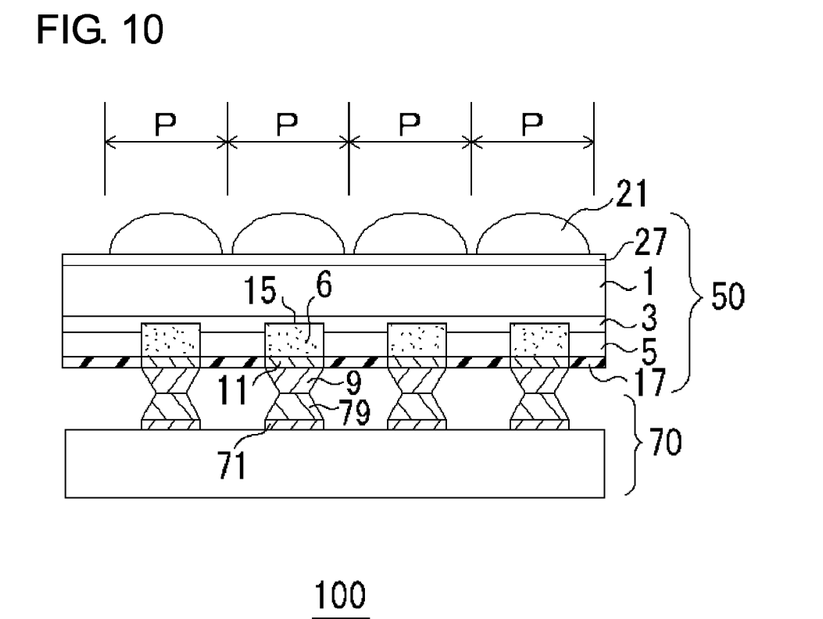
FIG. 10 is a view illustrating a light receiving device and an optical device according to Embodiment 4 of the present invention.

FIG. 10 is a view illustrating a light receiving device 50 and an optical device 100 according to Embodiment 4. In Embodiments 1 to 3, the microlenses 21 are arranged directly on the rear surface of the InP substrate 1. In contrast, in the present embodiment, a SiN film or SiON film 27 is arranged between microlenses 21 and the rear surface of an InP substrate 1. With this structure, an antireflection effect due to the SiN film or SiON film 27 is obtained, and the responsivity can be improved. In addition, since the SiN film or the SiON film has a good adhesiveness (adhesion property) with a resin such as a fluororesin, the microlenses or the microlens array can be reliably fixed. The microlenses may be produced by any of the methods described in Embodiments 1 to 3. Although a trench or a wall between microlenses is not illustrated in FIG. 10, a trench or a wall may be arranged between the microlenses 21.

In a certain case, there may be a problem in terms of adhesiveness between the SiN film or the SiON film and a fluororesin. In such a case, a trace amount of additive is incorporated in the fluororesin. Alternatively, a solvent containing the additive may be applied onto the SiN film or the SiON film, and the resulting substrate may then be allowed to stand at a high temperature to volatilize the solvent, thereby further improving the adhesive force with the SiN film or the SiON film. Examples of the most suitable material used as the trace amount of treatment agent include silane treatment agents having a relatively low content of a C—H bond, such as an amine silane coupling agent (KBM 903 manufactured by Shin-Etsu Chemical Co., Ltd.), a mercapto silane coupling agent (KBM 803 manufactured by Shin-Etsu Chemical Co., Ltd.), and a methacryl silane coupling agent (KBM 503). The amount of silane treatment agent used is preferably about 1 part by weight or less relative to 100 parts by weight of the non-crystalline fluororesin from the standpoint of the adhesiveness between the SiN film or the SiON film and the fluororesin and a decrease in the transmittance in the wavelength range of 0.7 to 3 μm, the decrease being due to an increase in the C—H bond.

(Embodiment 5)

Figure 11:
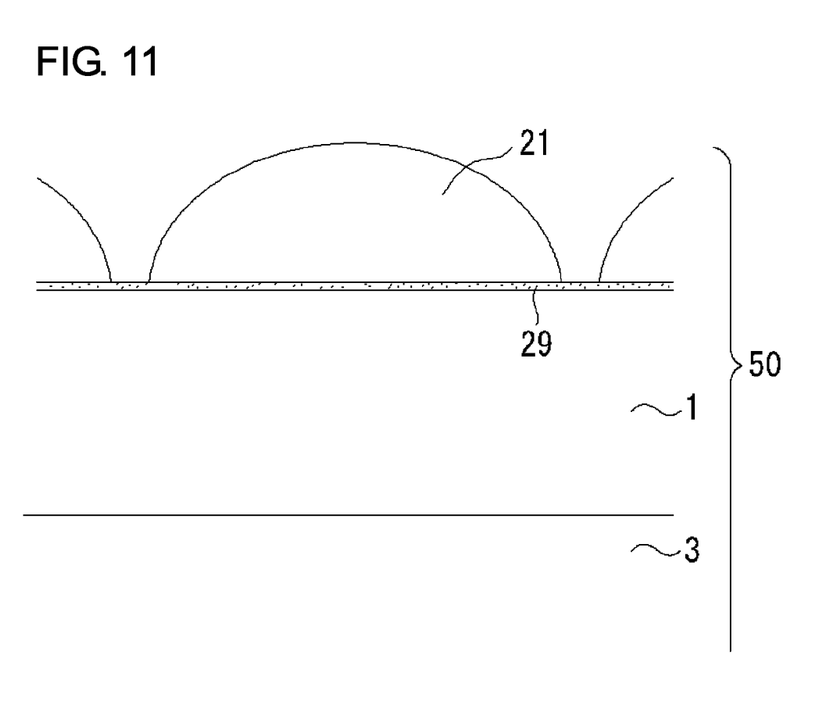
FIG. 11 is a partially enlarged view of a light receiving device according to Embodiment 5 of the present invention.

FIG. 11 is a partially enlarged view of a light receiving device 50 according to Embodiment 5. In Embodiment 4, a SiN film or a SiON film is arranged between the microlenses 21 and the InP substrate 1. In the present embodiment, in order to improve adhesiveness between a fluororesin to be formed into microlenses and an InP substrate, a treatment base layer 29 is formed on the rear surface of an InP substrate 1. Specifically, before droplet-shaped bodies or mountain-shaped bodies composed of a fluororesin-containing agent are formed, a silane coupling agent serving as a treatment agent is sprayed onto the rear surface of the InP substrate 1 two or three times with a sprayer, and the substrate may be dried at 85° C. for about two hours. Thus, the treatment base layer 29 is formed. In the subsequent step, microlenses 21 may be produced by any of the methods described in Embodiments 1 to 4. With this structure, the microlenses 21 are strongly fixed to the rear surface of the InP substrate 1.

In this case, a silane coupling agent serving as a treatment agent need not be incorporated in advance in the non-crystalline fluororesin forming the microlenses 21. In addition, by conducting the drying step, it is possible to suppress, in the microlenses etc., the presence of an unnecessary C—H-bond-containing substance, which adversely affects the optical transparency in the wavelength range of 0.7 to 3 μm.

Embodiments and Examples of the present invention have been described above. The embodiments and Examples of the present invention disclosed above are only illustrative, and the scope of the present invention is not limited to these embodiments of the invention. It is to be understood that the scope of the present invention is defined by the description of Claims and includes the equivalents of the description in Claims and all modifications within the scope of Claims.

Industrial Applicability

According to the light receiving device etc. of the present invention, by arranging particular microlenses, a high-quality light-receiving signal can be obtained with a high responsivity in the near-infrared to infrared region having a wavelength of about 0.7 to 3 μm. Since the microlenses are composed of a fluororesin, the microlenses have a flat transmittance-wavelength characteristic in which there is no absorption in the near-infrared region and a long-wavelength region of the near-infrared region. Therefore, a highly reliable light-receiving signal can be obtained while obtaining an advantage of the ease of processing of the resin.

The invention claimed is:

1. A light receiving device including a plurality of pixels formed on an InP substrate, the light receiving device comprising:
    a microlens located in each of regions corresponding to the pixels, the microlens being disposed on a rear surface of the InP substrate,
    wherein the microlens is formed by using a resin material having a variation range of a transmittance of light in the wavelength region between 0.7 and 3 μm of 25% or less, the transmittance being 70% or more.

2. The light receiving device according to claim 1, wherein the resin material does not include a C—H bond.

3. The light receiving device according to claim 1, wherein the resin material is a fluororesin.

4. The light receiving device according to claim 3, wherein the fluororesin is a non-crystalline fluororesin having a basic unit represented by chemical formula (1):

[Chem. 1]

(1)

n: 1~6 where m (>1) represents the number of repetitions, and the structure in ( )$_m$ is a basic unit.

5. The light receiving device according to claim 1, wherein a SiN coating film or a SiON coating film is provided between the rear surface of the InP substrate and the microlens.

6. The light receiving device according to claim 1, wherein a SiN coating film or a SiON coating film is provided between the rear surface of the InP substrate and the microlens, (i) a treatment agent for enhancing an adhesive force of the SiN film or the SiON film is provided on a surface of the SiN film or the SiON film or (ii) a treatment agent for enhancing an adhesive force is contained in the resin material constituting the microlens, and the microlens is fixed to the SiN film or the SiON film with the treatment agent therebetween.

7. The light receiving device according to claim 1, wherein a treatment base layer composed of a treatment agent for enhancing an adhesive force is provided on the rear surface of the InP substrate, and the microlens is fixed to the rear surface of the InP substrate with the treatment base layer therebetween.

8. The light receiving device according to claim 1, wherein a trench or a wall is provided along a boundary between the pixels so as to surround the microlens, a depth of the trench or a height of the wall being equal to or smaller than a thickness of the microlens.

9. The light receiving device according to claim 1, wherein an absorption layer and a window layer are provided on the InP substrate, a light-receiving portion that constitutes a core of each of the pixels and that receives light includes a p-n junction formed in the absorption layer by selectively diffusing an impurity from the window layer, the light-receiving portion is separated from an adjacent light-receiving portion by a region that is not subjected to the selective diffusion, the pixel is surrounded by the region that is not subjected to the selective diffusion so that the light-receiving portion is located as a center, and the microlens is concentric with the light-receiving portion and covers the region that is not subjected to the selective diffusion.

10. The light receiving device according to claim 9, wherein the p-n junction may be a p-i junction, an n-i junction, or the like, and a p concentration in the p-i junction or an n concentration in the n-i junction is substantially as low as a background.

11. The light receiving device according to claim 9, wherein a diameter of the light-receiving portion is substantially the same as a minimum width of the region that is not subjected to the selective diffusion, and the microlens is formed so as to occupy the pixel so that the shape of the microlens is inscribed in a section of the pixel.

12. The light receiving device according to claim 9, wherein the absorption layer is constituted by a type-II multi-quantum well structure (MQW) composed of two group III-V compound semiconductors that are lattice-matched with InP in a range of ±0.5%.

13. An optical device comprising the light receiving device according to claim 1 and a read-out integrated circuit (ROIC).

14. A method for producing a light receiving device comprising the steps of:
forming, on an InP substrate, an array of light receiving elements having a responsivity at a wavelength of at least 1 to 2.5 μm, the light receiving elements functioning as pixels; and
forming a microlens array over an entire surface of the InP substrate by providing, on a rear surface of the InP substrate, a microlens for each of the pixels, the microlens containing a fluororesin as a main component,
wherein, in the step of forming a microlens array, a fluororesin-containing agent prepared by dissolving a fluororesin in a solvent and adjusting a viscosity of the resulting solution is discharged using a micronozzle to form a droplet-shaped body or mountain-shaped body composed of the fluororesin-containing agent in each of regions of the pixels, and a drying treatment is then performed to form the microlens array composed of the fluororesin.

15. The method for producing a light receiving device according to claim 14, further comprising, before the step of forming a microlens array, a step of forming a trench or a wall at a boundary between the adjacent pixels so as to prevent the droplet-shaped body or mountain-shaped body composed of the fluororesin-containing agent from contacting and combining with a droplet-shaped body or mountain-shaped body of an adjacent pixel, the droplet-shaped body or mountain-shaped body being composed of the fluororesin-containing agent.

16. The method for producing a light receiving device according to claim 15, wherein, in the step of forming a wall, a covering layer is formed on the rear surface of the InP substrate, and a portion of the covering layer other than a portion to be formed into the wall is removed by etching.

17. The method for producing a light receiving device according to claim 14, wherein, after the array of light receiving elements is formed on the InP substrate and before the microlens is provided, a coating film which is a SiN film or a SiON film is formed on the InP substrate, and the microlens is then provided in contact with the coating film.

18. The method for producing a light receiving device according to claim 14, wherein, on the InP substrate, (i) a SiN film or a SiON film is formed, in forming the film, a treatment agent for enhancing an adhesive force of the SiN film or the SiON film is applied onto a surface of the SiN film or the SiON film, and the microlens array is then formed, or (ii) a SiN film or a SiON film is formed, and the microlens is then provided by using a fluororesin-containing agent prepared by incorporating in advance a treatment agent for enhancing an adhesive force in the fluororesin.

19. The method for producing a light receiving device according to claim 14, wherein a treatment base layer composed of a treatment agent for enhancing an adhesive force is formed on the rear surface of the InP substrate, and the microlens is provided on the treatment base layer.

20. A method for producing a light receiving device comprising the steps of:
forming, on an InP substrate, an array of light receiving elements having a responsivity at a wavelength of at least 1 to 2.5 μm, the light receiving elements functioning as pixels; and
forming a microlens array over an entire surface of the InP substrate by providing, on a rear surface of the InP substrate, a microlens for each of the pixels, the microlens containing a fluororesin as a main component,
wherein the step of forming a microlens array includes the steps of preparing a die functioning as a female die of the microlens array, applying, onto the rear surface of the InP substrate, a fluororesin-containing agent prepared by dissolving the fluororesin in a solvent and adjusting a viscosity of the resulting solution to form a coating layer, and pressing the die onto the coating layer that is moderately dried, while adjusting the position of the die to the position of the pixels, to form a microlens array in which convex lenses functioning as microlenses are arranged.

* * * * *